United States Patent [19]
Roth

[11] Patent Number: 5,938,854
[45] Date of Patent: Aug. 17, 1999

[54] METHOD AND APPARATUS FOR CLEANING SURFACES WITH A GLOW DISCHARGE PLASMA AT ONE ATMOSPHERE OF PRESSURE

[75] Inventor: John Reece Roth, Knoxville, Tenn.

[73] Assignee: The University of Tennessee Research Corporation, Knoxville, Tenn.

[21] Appl. No.: 08/458,136

[22] Filed: Jun. 2, 1995

Related U.S. Application Data

[63] Continuation-in-part of application No. 08/068,739, May 28, 1993, Pat. No. 5,456,972, and a continuation-in-part of application No. 08/254,264, Jun. 6, 1994, Pat. No. 5,669,583.

[51] Int. Cl.⁶ ..................................................... C23F 1/00
[52] U.S. Cl. ........................... 134/1; 156/643.1; 156/345; 156/345 V; 216/67; 216/72
[58] Field of Search ..................... 156/643.1, 345; 216/67, 72; 134/1

[56] References Cited

U.S. PATENT DOCUMENTS

| | | | |
|---|---|---|---|
| 2,946,541 | 7/1960 | Boyd | 244/42 |
| 3,095,163 | 6/1963 | Hill | 244/12 |
| 3,162,398 | 12/1964 | Clauser et al. | 244/14 |
| 3,360,220 | 12/1967 | Meyer | 244/42 |
| 3,507,348 | 4/1970 | Aronson | 244/405 |
| 3,510,094 | 5/1970 | Clark | 244/130 |
| 4,464,223 | 8/1984 | Gorin | 156/643 |
| 4,465,547 | 8/1984 | Belke, Jr. et al. | 156/629 |
| 4,469,932 | 9/1984 | Spiegelberg et al. | 219/121 PA |
| 4,504,349 | 3/1985 | Ueno et al. | 216/67 |
| 4,555,303 | 11/1985 | Legge et al. | 156/643 |
| 4,668,366 | 5/1987 | Zarowin | 156/345 |
| 4,687,573 | 8/1987 | Miller et al. | 210/143 |
| 4,771,730 | 9/1988 | Tezuka | 118/723 |
| 4,804,431 | 2/1989 | Ribner | 156/345 |
| 4,919,968 | 4/1990 | Buhl et al. | 427/37 |
| 4,931,135 | 6/1990 | Horiuchi et al. | 216/67 |

(List continued on next page.)

FOREIGN PATENT DOCUMENTS

| | | |
|---|---|---|
| 068775 | 1/1983 | European Pat. Off. . |
| 117561 | 9/1984 | European Pat. Off. . |
| 292582 | 8/1991 | Germany . |
| 58-200529 | 11/1983 | Japan . |
| 62-2544 | 1/1987 | Japan . |
| 4225226 | 8/1992 | Japan . |

OTHER PUBLICATIONS

Kanazawa, S. et al., "Stable Glow Plasma at Atmospheric Pressure", *J. Phys. D: Appl. Phys.*, vol. 21, pp. 838–840 (1988).

Kanda, N. et al., "Atmospheric Pressure Glow Plasma and its Application to Surface Treatment and Film Deposition", *International Symposium on Plasma Chemistry*, Symposium Proceedings, vol. 3, Bochum, Germany (Aug. 4–9, 1991).

Kogoma, M. et al., "Wettability Control of a Plastic Surface by $CF_4$–$O_2$ Plasma and Its Etching Effect", *J. Phys. D: Appl. Phys.*, vol. 20 (1987).

Liu, C., "Plasma–Related Characteristics of a Steady–State Glow Discharge at Atmospheric Pressure", Presented at the 1993 Sigma XI Graduate Student Paper Competition, The University of Tennessee, Knoxville TN (Mar. 4, 1993).

(List continued on next page.)

*Primary Examiner*—Jill Warden
*Assistant Examiner*—S. Carrillo
*Attorney, Agent, or Firm*—Weiser and Associates, P.C.

[57] ABSTRACT

The surface of a workpiece is cleaned by generating a steady-state one atmosphere glow discharge plasma above the surface of the workpiece. The use of one atmosphere, uniform glow discharge plasmas generated by a low frequency RF ion trapping mechanisms is preferred. The plasma used to effect surface cleaning may be formed in atmospheric air or other gases at about one atmosphere of pressure, or at pressures below or above one atmosphere.

49 Claims, 7 Drawing Sheets

U.S. PATENT DOCUMENTS

| | | | |
|---|---|---|---|
| 4,968,374 | 11/1990 | Tsukada et al. | 156/345 |
| 4,980,022 | 12/1990 | Fujimora et al. | 134/1 |
| 5,061,359 | 10/1991 | Babu et al. | 204/298.07 |
| 5,102,496 | 4/1992 | Savas et al. | 156/345 |
| 5,147,493 | 9/1992 | Nishimura | 156/345 |
| 5,162,633 | 11/1992 | Sonobe et al. | 156/345 |
| 5,163,458 | 11/1992 | Monroe | 134/1 |
| 5,213,658 | 5/1993 | Ishida | 156/643 |
| 5,227,172 | 7/1993 | Deeds | 425/72.2 |
| 5,252,178 | 10/1993 | Moslehi | 134/1 |
| 5,261,965 | 11/1993 | Moslehi | 134/1 |
| 5,266,153 | 11/1993 | Thomas | 134/1 |
| 5,270,137 | 12/1993 | Kubota | 429/249 |
| 5,272,417 | 12/1993 | Ohmi | 315/111.21 |
| 5,309,063 | 5/1994 | Singh | 315/111.51 |
| 5,387,842 | 2/1995 | Roth et al. | 315/111.21 |
| 5,403,453 | 4/1995 | Roth et al. | 204/164 |
| 5,414,324 | 5/1995 | Roth et al. | 315/111.21 |
| 5,415,719 | 5/1995 | Akimoto | 156/345 |
| 5,456,796 | 10/1995 | Gupta et al. | 134/1 |
| 5,456,972 | 10/1995 | Roth et al. | 428/224 |
| 5,464,499 | 11/1995 | Moslehi et al. | 134/1 |
| 5,507,874 | 4/1996 | Su et al. | 134/1 |
| 5,531,862 | 7/1996 | Otsubo et al. | 156/345 |

OTHER PUBLICATIONS

Liu, C. and Roth, J.R., "Characteristics of a Steady–State, Low Power Glow Discharge at Atmospheric Pressure", *Bulletin of the American Physical Society, SeriesII*, vol. 37, No. 6, p. 1563 et seq. (Nov., 1992).

Malik, M.R. et al., "Ion Wind Drag Reduction", *AIAA 21st Aerospace Sciences Meeting* (AIAA–83–0231), Reno, Nevada (Jan. 10–13, 1983).

Rakowski, W., "Plasma Modification of Wool Under Industrial Conditions", *Melliand Textilberichte*, vol. 70, pp. 780–785 (1989).

Rakowski, W., "Effect and Cost of Plasma Treatment of Polypropylene Melt Blown Webs", *Second Annual TANDEC Conference* (Oct. 13–16, 1992).

Reitz, H. et al., "Power Modulation For Dielectric Barrier–Discharges", Paper presented at Twentieth Power Modulator Symposium (1992).

Roth, J.R. et al., "Experimental Generation of a Steady–State Glow Discharge at Atmospheric Pressure", *1992 (19th) IEEE International Conference on Plasma Science*, Conference Record–Abstracts, Paper 5P–21, IEEE Catalog No. 92–TH0460–6, ISBN –7803–0716–X, pp. 170–171, Tampa, Florida (Jun. 1–3, 1992).

Roth, J.R. et al., "Plasma–Related Characteristics of a Steady–State Glow Discharge at Atmospheric Pressure", Paper 2P–18, *Proc. 1993 IEEE International Conference on Plasma Science*, Vancouver, B.C., IEEE Catalog No. 93–CH3334–0, ISBN 0–7803–1360–7, p. 129 (1993).

Roth, J.R. et al., "Preliminary Measurements of the Plasma Properties of a One Atmosphere Glow Discharge Plasma", Paper presented at 35th Annual Meeting of the APS Division of Plasma Physics, *APS Bulletin*, Series II, vol. 38, No. 10, p. 1901 St. Louis, MO (Nov. 1–5, 1993).

Von Engel, A. et al., "On the Glow Discharge At High Pressure", *Ziet, für Physik*, vol. 85, pp. 144–160 (1993); including an English language translation of the original German Text.

Wakida, T. et al., "Changes in Surface Properties of Poly(ethylene terephthalate) Treated with Low Temperature Plasma: Effect of Pretreatment with Dimethylformamide", *Sen–I Gakkaishi*, vol. 42, No. 2 (1986).

Wakida, T. et al., "Surface Free Energy of Poly(ethylene terephthalate) and Nylon 6 Films Treated With Low Temperature Plasma", *Sen–I Gakkaishi*, vol. 43, No. 7 (1987).

Yokoyama, T. et al., "The Mechanism of the Stabilization of Glow Plasma At Atmospheric Pressure", *J. Physics D.: Appl. Phys.*, vol. 23, 1125–1128 (1990).

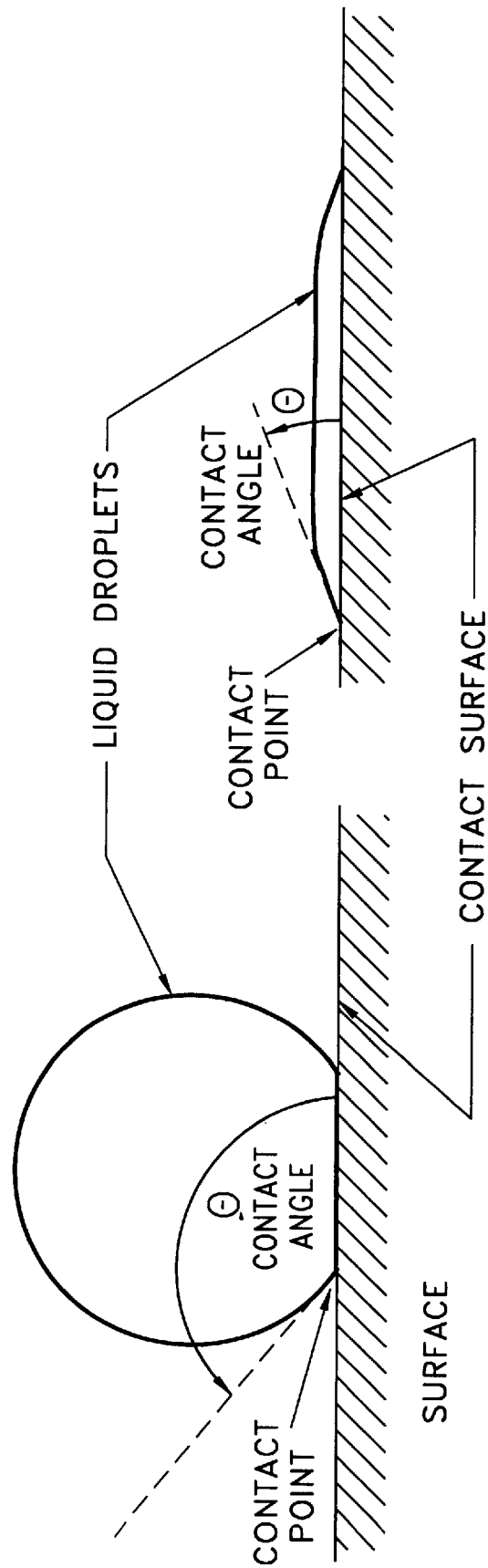

METHOD AND APPARATUS FOR CLEANING SURFACES WITH A GLOW DISCHARGE PLASMA AT ONE ATMOSPHERE OF PRESSURE

RELATED APPLICATIONS

This patent application claims the benefit of the filing dates of and is a continuation-in-part application of application Ser. No. 08/068,739, filed May 28, 1993, now U.S. Pat. No. 5,456,972 and of application Ser. No. 08/254,264, filed Jun. 6, 1994, now U.S. Pat. No. 5,669,583, both applications being incorporated herein by reference.

BACKGROUND OF THE INVENTION

The present invention relates to a method and apparatus for cleaning surfaces, including metals and plastics, to a higher level of cleanliness than is possible with conventional solvents, acid baths, or detergents. More specifically, the present invention is directed to the cleaning of surfaces using the active species from a glow discharge plasma which is capable of operating at one atmosphere of pressure.

It has been found that plasma-cleaned surfaces can provide a substrate for more corrosion-resistant electroplated surfaces, greater adhesion of electroplated layers, greater adhesion of paint to surfaces, stronger adhesive bonding of surfaces, and many other industrial applications in which surface cleanliness is a factor, including the sterilization of surfaces. Operation of the plasma-cleaning process at one atmosphere would eliminate the need for costly vacuum systems and batch processing associated with presently existing low pressure glow discharge and plasma processing used industrially.

In the physical sciences, the term "plasma" describes a partially or fully ionized gas, which is sometimes referred to as a "fourth state of matter". Industrial plasmas, such as are described herein, are partially ionized and consist of ions, electrons and neutral species. This state of matter can be produced by the action of very high temperatures, or strong direct current (DC) or radio frequency (RF) electric fields.

High energy density, high intensity plasmas are represented by stars, nuclear explosions, plasma torches and electrical arcs. Medium energy density, glow discharge plasmas are produced by free electrons which are energized by an imposed DC or RF electric field, causing collisions with neutral molecules. These collisions with neutral molecules transfer energy to the molecules and to the ions, forming a variety of active species which may include photons (both ultraviolet and visible), excited atoms and molecules, metastables, individual atoms, free radicals, molecular fragments, monomers, electrons and ions. These active species can have energies, or be in excited energy states, of several or even several tens of electron volts (one electron volt approximates 11,600° K). This is far higher than the chemical binding energy associated, for example, with chemical cleaning processes. These active species can then form a more energetic medium for plasma cleaning (to effectively remove more tightly bound monolayers of dirt and contaminants on surfaces) than can be reached with less energetic chemical cleaning processes. Low power density, low intensity plasmas, such as dark discharges and coronas, have been used at low pressure and at one atmosphere for the surface treatment of various materials. However, because of their relatively low energy density, corona discharges can alter many surface properties of materials only relatively slowly, if at all.

The use of corona discharges for surface cleaning is, in general, unsatisfactory because of their low power density; and filamentary discharges of moderate average power density, because of their non-uniformity of effect. The use of arcs or plasma torches is also unsatisfactory because their energy densities are sufficiently high to damage many treated materials.

In many applications, glow discharge plasmas have the advantage of providing enough active species to produce important effects, but are not of sufficiently high intensity to damage the surface being treated. However, it is important to note that glow discharge plasmas have heretofore typically been successfully generated in low pressure or partial vacuum environments (e.g., below 10 torr). This usually necessitates a batch processing of treated materials, and the use of vacuum systems, which are expensive to buy and maintain.

An essential feature of the present invention is to be able to plasma-clean surfaces at one atmosphere. Preferably, this is accomplished using a uniform glow discharge plasma capable of operating at one atmosphere, and at moderate plasma power densities which will provide an adequate intensity of active species without damaging the surface to be treated. The generation of low, moderate and high power density plasmas at one atmosphere is generally known. Such plasmas may be generated, for example, using the one atmosphere uniform glow discharge plasma reactors described in U.S. Pat. Nos. 5,387,842, 5,403,453 and 5,414,324, as well as U.S. patent applications Ser. No. 08/068,739 (filed May 28, 1993) and 08/254,264 (filed Jun. 6, 1994), the subject matter of each of which is fully incorporated herein by reference.

SUMMARY OF THE INVENTION

It is therefore the primary object of the present invention to provide a method and apparatus for the plasma cleaning of surfaces such as metals, plastics, paper and other materials with a uniform glow discharge plasma at various pressures, including one atmosphere.

It is also an object of the present invention to provide plasma-cleaned surfaces which reach a higher state of cleanliness, as measured by a standard water drop and contact angle test, than is possible with conventional cleaning processes involving solvents, detergents, acid baths, agitation or abrasion.

It is also an object of the present invention to provide plasma-cleaned surfaces showing greatly improved adhesion of paints, adhesive agents, films, electroplated coatings, and the like.

It is also an object of the present invention to provide plasma-cleaned surfaces for purposes of sterilization, and for applications such as microelectronics.

In accordance with the present invention, a steady-state one atmosphere glow discharge plasma is generated above the surface of the workpiece to be cleaned. The use of one atmosphere, uniform glow discharge plasmas generated by microwave, RF, or low frequency RF ion trapping mechanisms is preferred. The plasma used to effect surface cleaning may be formed in atmospheric air or other gases at about one atmosphere of pressure, or at pressures below or above one atmosphere. The plasma may be formed by the previously described low frequency, ion trapping mechanism, by other RF or microwave generated glow discharge plasmas such as those described by Vidmar, R. J., *Plasma Cloakina: Air Chemistry, Broadband Absorption, and Plasma Generation*, Final Report, SRI Project 8656 (Menlo Park, Calif.: SRI International) (1991); Mitsuda, Y., et al., "Development of a New Microwave Plasma Torch and its Application to Diamond Synthesis", *Rev. Sci. Instrum.*, 60 249–252 (1989) and MacDonald, A. D., *Microwave Breakdown in Gases* (New York: John Wiley), LCCCN 66-22841 (1966), or even by corona discharges (although the low power densities of corona discharges would tend to require relatively long exposure times).

For surfaces which are electrical conductors, the workpiece to be cleaned may either be one of the RF electrode plates of the plasma reactor, or inserted between the electrode plates of the plasma reactor. The workpiece may be either floating or biased with respect to the plasma potential. For surfaces which are electrical insulators, the workpiece to be cleaned may be exposed to the active species of the plasma by insertion in a plasma generated between two parallel plates.

If the workpiece has a complicated, three-dimensional configuration (e.g., an automobile bumper), the necessary plasma may be generated by using the workpiece (if electrically conducting) as one electrode, and a mould-like image of the workpiece as the corresponding (second) electrode. An alternative arrangement useful for both insulating and electrically conducting three-dimensional workpieces is to face the surface to be treated with a mould-like image having a surface with strip electrodes which can be used to generate a plasma (e.g., using the previously mentioned, low frequency ion trapping mechanism). In this latter embodiment, a steady-state uniform one atmosphere glow discharge plasma is generated on and above the surface of the conforming mould, providing plasma immersion and active species for the facing workpiece. The conforming mould can be an insulator with parallel strip electrodes over the surface, or an electrical conductor supporting strip electrodes which are insulated from the mold-image and which are spaced from and generally parallel to each other.

The mold-image and the strip electrodes, or if the mold-image is an insulator, the alternating strip electrodes, are connected to opposite poles of a radio frequency (RF) power source. To generate the necessary plasma, one or more of the strip electrodes connected to one terminal of the RF power source are energized relative to one or more adjacent strip electrodes, or relative to the conducting mold-image, connected to the other RF terminal. The RF power is of high enough voltage to generate the glow discharge above the surface of the mold-image. A local electric field in the vicinity of the strip electrodes of about 10 kilovolts per centimeter is suitable for plasma generation in atmospheric air.

The RF power is of relatively low frequency for the ion trapping uniform glow discharge mechanism. The frequency should be sufficiently high that the ions generated along the electric field lines in the plasma between the electrodes do not have time to impact either electrode during a half cycle of oscillation along the electric field lines. However, the frequency should be sufficiently low so that the electrons of the plasma are not also trapped in the plasma, but have time to impact the surface of the electrodes or the mold-image during a half cycle of oscillation. A frequency from about 100 Hz to about 30 kHz will normally be suitable, depending on electric field, geometry, and other factors. By this mechanism, the positive ion content of the plasma builds up, while the electrons flow to the electrodes or accumulate on the surface of the mold-image. This acts to allow a steady state uniform glow discharge plasma to form, rather than the filamentary discharge which is normally associated with the trapping of both ions and electrons.

Without wishing to be bound by such explanation, the following is the most probable physical process by which the active species actually clean the surfaces to which they are exposed when employing the previously described techniques for producing a uniform glow discharge plasma at one atmosphere, in order to obtain the plasma-generated active species for effecting such plasma cleaning.

At one atmosphere, the surface of the material is covered by up to several hundred monolayers of adsorbed contaminants. These monolayers might consist of atmospheric or other gases from the environment to which the workpiece is exposed, particularly in the outer layers, and/or hydrocarbon machining oils or plasticizers, particularly in the lowermost monolayers, adjacent to the workpiece. The outermost monolayers are very loosely bound to the workpiece and ordinary (room temperature) thermal energies of approximately 0.025 electron volts are generally adequate to dislodge them. However, as the surface of the workpiece is approached, the binding energy of the adsorbed monolayers increases, reaching values approaching that of the work function of the workpiece (e.g., a magnitude of 4.5 electron volts for many materials).

This gradation in the binding energy of the adsorbed monolayers makes it relatively easy to remove the outermost monolayers by detergents, solvents, acid baths, or other chemical means. However, such chemical means are not sufficiently energetic to remove the last few, and most tightly bound monolayers. These remaining monolayers are often machining oils, in the case of metals, and plasticizers, in the case of polymers or plastics. Only a few such monolayers are required to adversely affect the surface free energy, the water droplet contact angle, and the wettability of the surface. The usual result of the presence of such monolayers is to reduce the wettability and adhesion of other materials to the surface of the workpiece. This can lead to the peeling of electroplated surface layers, the peeling or flaking of paint and/or the failure of adhesive bonding to the material.

While it is generally very difficult, if not virtually impossible to remove these last few monolayers by ordinary chemical means, their removal is made possible using the more energetic active species derived from a one atmosphere uniform glow discharge plasma. The electron kinetic temperature and/or energy in the plasma, and the energy of excited states such as those which produce visible and ultraviolet line radiation, for example, are on the order of several electron volts. This is comparable to the energy with which the bottom-most monolayers are bound, and well above the energy associated with chemical species and chemical cleaning methods. Thus, the use of active species from a plasma is in principle capable of removing more and deeper monolayers adsorbed on a surface than purely chemical treatments, leading to an unprecedented high degree of cleanliness. This is useful for purposes of sterilization and for applications such as microelectronics, as well as to significantly improve the adhesion of paints, electroplated layers, and bonding agents, among others.

BRIEF DESCRIPTION OF THE DRAWINGS

FIGS. 6a and 6b are elevational views comparing the contact angle and wettability of conventionally cleaned and plasma cleaned mild steel surfaces.

DETAILED DESCRIPTION OF PREFERRED EMBODIMENTS

The present invention is directed to methods and apparatus for cleaning surfaces, including metals and plastics, to a higher level of cleanliness than is possible with conventional methods, by using a glow discharge plasma which is capable of operating at one atmosphere of pressure.

The plasma may be formed in atmospheric air or other gases at about one atmosphere of pressure. The plasma may also be formed at pressures below or above atmospheric pressure, if desired. Gases other than air in which a glow discharge plasma can form may also be used. Such gases can include, but are not limited to, the noble gases such as helium, neon and argon, as well as nitrous oxide, carbon dioxide, nitrogen, and mixtures thereof or with air. Up to 20% oxygen can be mixed with the aforementioned gases, if desired.

The surfaces of a wide range of three-dimensional workpieces may be plasma cleaned in accordance with the present invention. The workpiece may be made of metal, polymer, plastic, paper, or other material, and the ability to operate at or near atmospheric pressure renders it unnecessary to employ batch processing or expensive vacuum systems, such as are required for low pressure (in vacuum) plasma cleaning methods.

The electrodes and the plasma may be exposed when the plasma is to be generated in air. In applications with potential environmental or occupational risks due to exposure to the gases generated, or otherwise, the apparatus and the workpiece treated in accordance with the present invention may be surrounded by a protective barrier. For instance, as will be discussed more fully below, an enclosure made of a material such as Plexiglas® sheet can readily be provided, to contain the equipment and the workpiece, to minimize ultraviolet hazards, and to minimize the leakage of harmful by-product gases or active species from the region of exposure defined above the workpiece. If used, such an enclosure may have a suitable inlet and outlet for the workpiece to be treated. In cases in which the plasma gas is other than ambient air, the enclosure serves the additional functions of retaining the treatment gas and preventing the surrounding medium from escaping the treatment zone.

Figure 1:
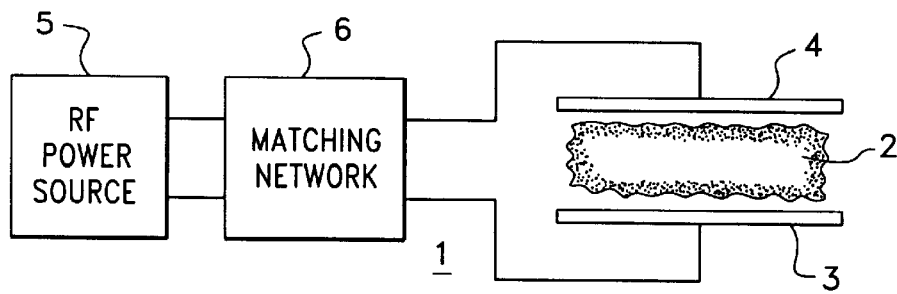
FIG. 1 is a schematic diagram showing a parallel plate electrode geometry for the cleaning of planar workpieces, using the workpiece as an electrode.

FIG. 1 shows an apparatus 1 for plasma cleaning a workpiece in accordance with the present invention. To this end, a steady-state uniform one atmosphere plasma 2 is generated between a pair of electrodes 3, 4. The electrically conducting surface to be cleaned (i.e., the workpiece) serves as one of the electrode 3, and a parallel surface 4 (formed of any of a variety of appropriate metals and electrical conductors) serves as the counter electrode. As will be discussed more fully below, the surface 4 can either be planar in the case of a flat workpiece, or a conforming mold-image in the case of a curved or three-dimensional workpiece.

Figure 1A:
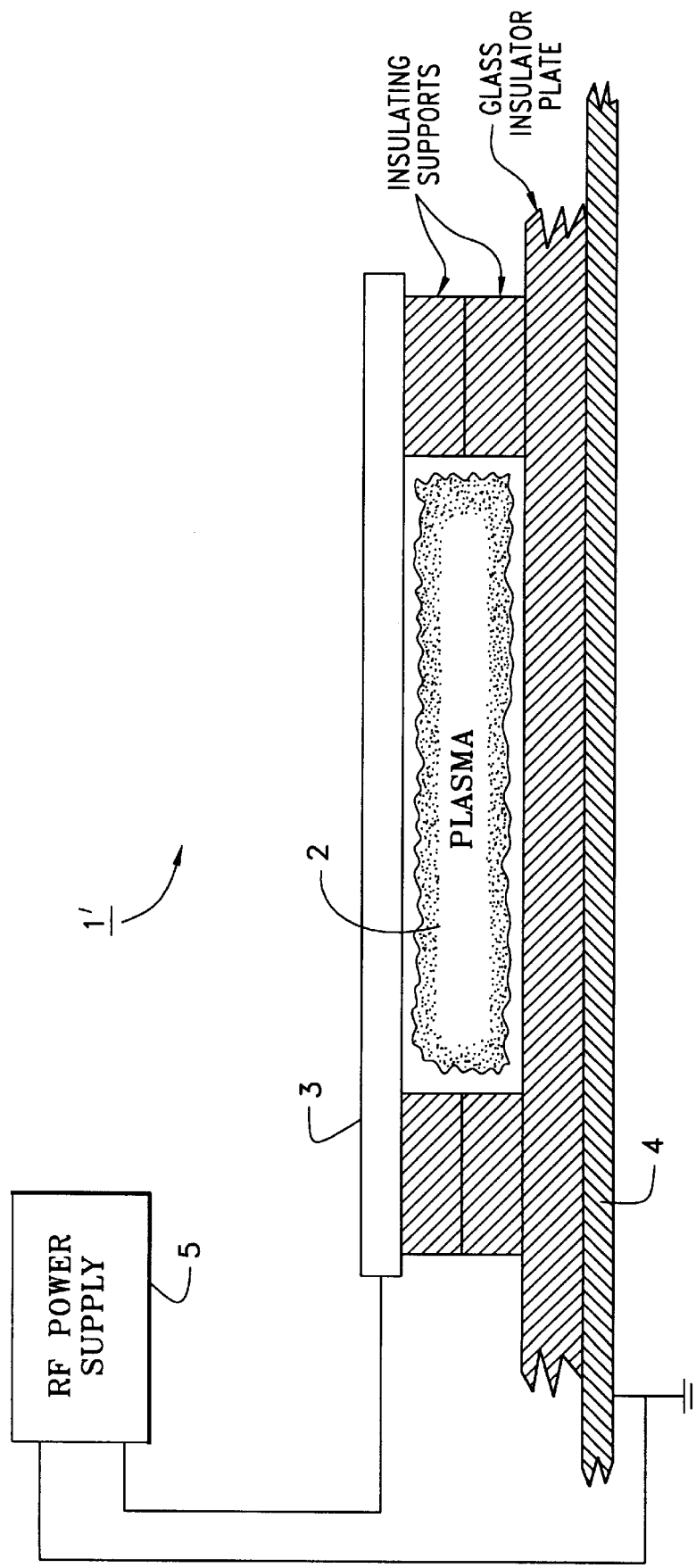
FIG. 1a is a schematic diagram showing an alternative embodiment parallel plate electrode geometry for the cleaning of workpieces.

The workpiece can have the plasma generated either on its outer surface, or on an inner surface (e.g., inside a hollow tube), as desired. For example, FIG. 1a shows an apparatus 1' which includes a pair of electrodes 3, 4, one of which (the electrode 3) is the workpiece. In this case, the inner surface of the workpiece is being cleaned. To this end, insulating supports are used to space the workpiece from the counter electrode.

At least one of the electrodes 3, 4 is preferably insulated (e.g., coated with a dielectric such as an oxide or glass, a flame-sprayed oxide, a silicon-based paint, etc.) to prevent arcing. For example, the counter electrode 4 of FIG. 1a includes a glass plate for purposes of insulation.

The conducting surface 3 and the conforming, parallel electrode 4 are each respectively connected to the opposite phases of the output of a radio frequency (RF) power source 5. A suitable matching network 6 is provided for matching the impedance load of the electrodes and the associated power source (i.e., to maximize efficient power transfer), in accordance with techniques which are otherwise known to the person of ordinary skill.

To generate a plasma using a low frequency ion trapping mechanism, as is preferred in accordance with the present invention, the RF voltage must be high enough to produce a breakdown electric field between the electrodes of approximately 10 kilovolts per centimeter or more for atmospheric air. The RF voltage must also be of such a frequency that the ions of the plasma, but not the electrons, are trapped between the electrodes. Typical frequencies for accomplishing this lie in a range of about 100 Hz to about 30 kHz. In this manner the positive ion content of the plasma builds up, producing an ambipolar quasi-neutrality with the electrons which are free to leave the plasma volume and be collected or recombine on the electrode surfaces. If the electrons are also trapped between the electrodes during a half cycle, an undesirable filamentary discharge can result. If only ions are trapped, this acts to allow a steady state, quasi-neutral uniform glow discharge plasma to form above the workpiece, between the RF electrodes.

Figure 2:
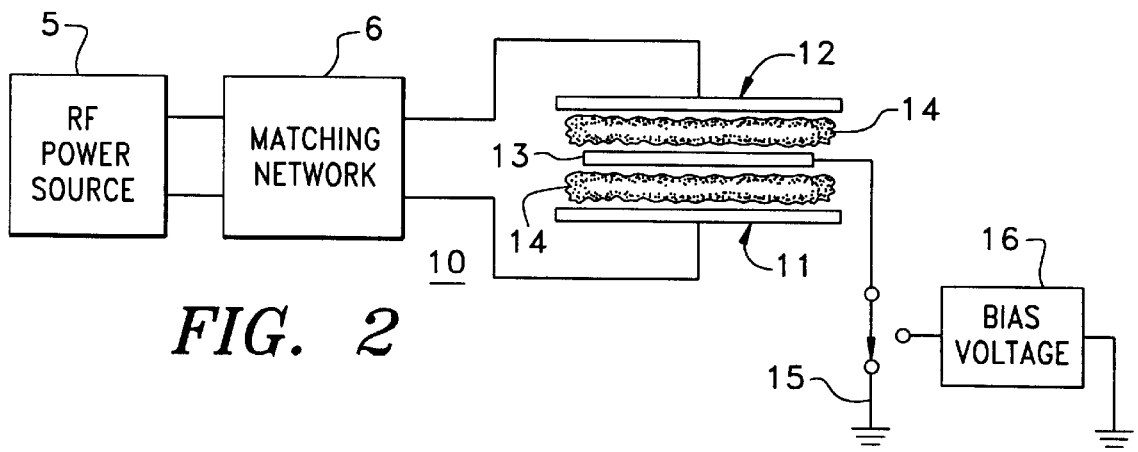
FIG. 2 is a schematic diagram showing a parallel plate electrode geometry for the cleaning of electrically conducting workpieces suspended between planar, parallel electrodes.
Figure 3A:
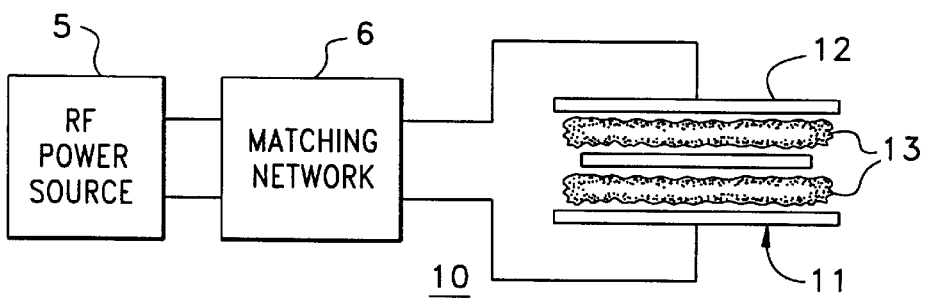
FIG. 3a is a schematic diagram showing a parallel plate reactor for the cleaning of an electrically insulating workpiece in a plasma generated between two planar, parallel electrodes of the reactor.
Figure 3B:
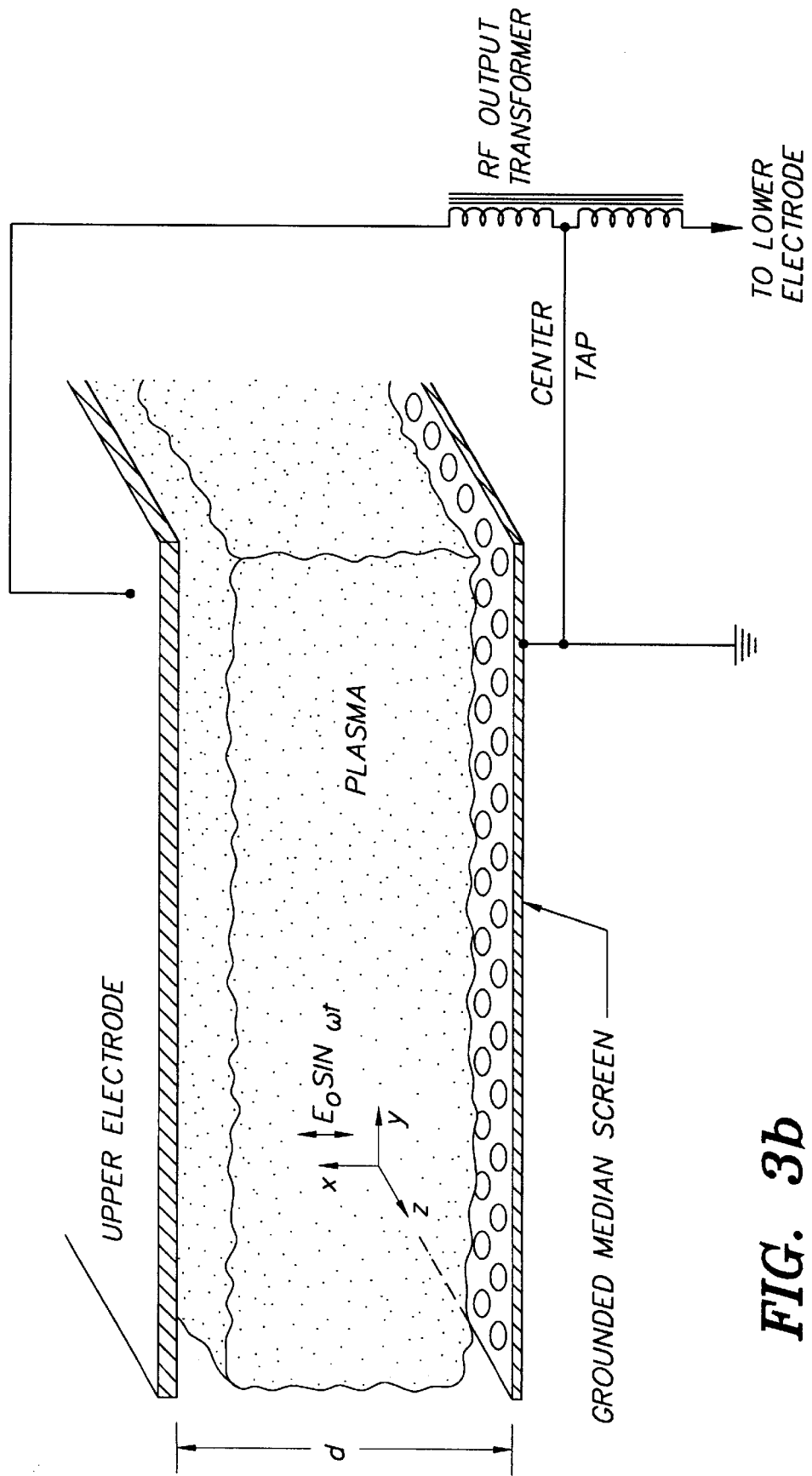
FIG. 3b is a schematic diagram showing an alternative embodiment parallel plate reactor for the cleaning of workpieces in a plasma generated between two planar, parallel plate electrodes.

FIG. 2 shows another embodiment of an apparatus 10 for plasma cleaning a workpiece in accordance with the present invention. The apparatus 10 substantially corresponds to the apparatus 1 of FIG. 1. However, in this case, paired parallel (or conforming) metallic electrodes 11, 12 are used to generate the plasma, as previously described, and the workpiece 13 is located in the plasma volume 14 developed between the two electrodes 11, 12. In such case, the workpiece 13 is either electrically grounded (at 15), or biased (at 16), as is appropriate for a given application. Because the workpiece 13 no longer serves as one of the operative electrodes, the apparatus 10 may also be used for the plasma cleaning of electrically insulating workpieces suitably positioned between the opposing electrodes 11, 12, as shown in FIG. 3a. It is also possible to position a grounded median screen between the electrodes 11, 12, as shown in FIG. 3b, developing two separate regions for containing a plasma (which could be used to clean two separate workpieces, or both sides of the same workpiece, if desired). In either case, suitable means are provided for supporting the workpiece between the electrodes during cleaning. A variety of webs, fabrics and films may be used for such purposes (as a support) provided the selected support (for supporting the workpiece) is maintained sufficiently close to the surface of the adjacent electrode to avoid interfering with the plasma (for treating the workpiece) which is developed.

Figure 4:
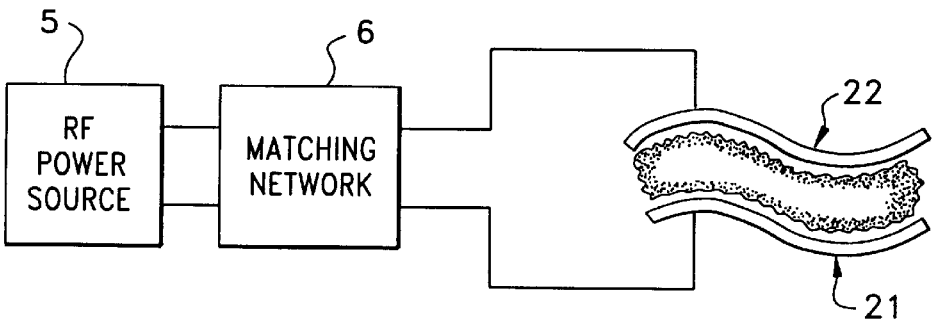
FIG. 4 is a schematic diagram showing a reactor for generating a plasma near the surface of a three-dimensional (curved), electrically conducting workpiece using a mold-image as the second electrode.

FIG. 4 shows another embodiment of an apparatus 20 for plasma cleaning a curved or three-dimensional workpiece in accordance with the present invention. The overall apparatus substantially corresponds to those previously described, except for the electrodes, which are shaped to the contours of the workpiece. To this end, the workpiece 21 advantageously acts as one of the electrodes. The counter electrode 22 is provided with a contour which conforms to the contour of the workpiece (the mold-image), as shown. In this mode, the respective electrodes 21, 22 are connected to the opposite phases of the output of the radio frequency (RF) power source 5, as previously described.

Figure 5A:
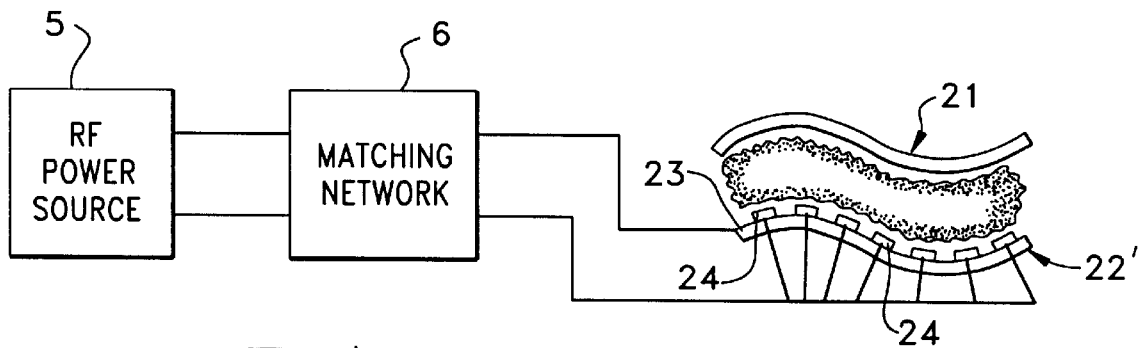
FIGS. 5a and 5b are schematic diagrams showing a reactor for generating a plasma near the surface of a three-dimensional (curved) workpiece using a conforming mold-image with parallel strip electrodes to generate the plasma.
Figure 5B:
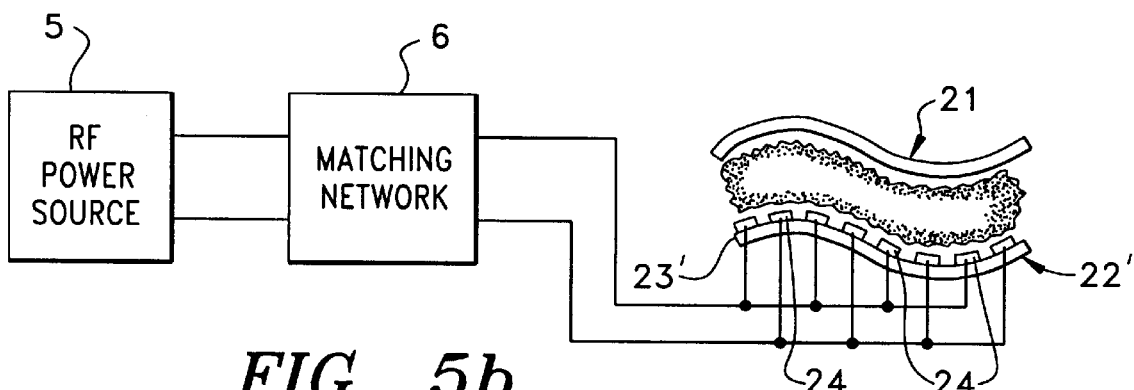
Figure 5C:
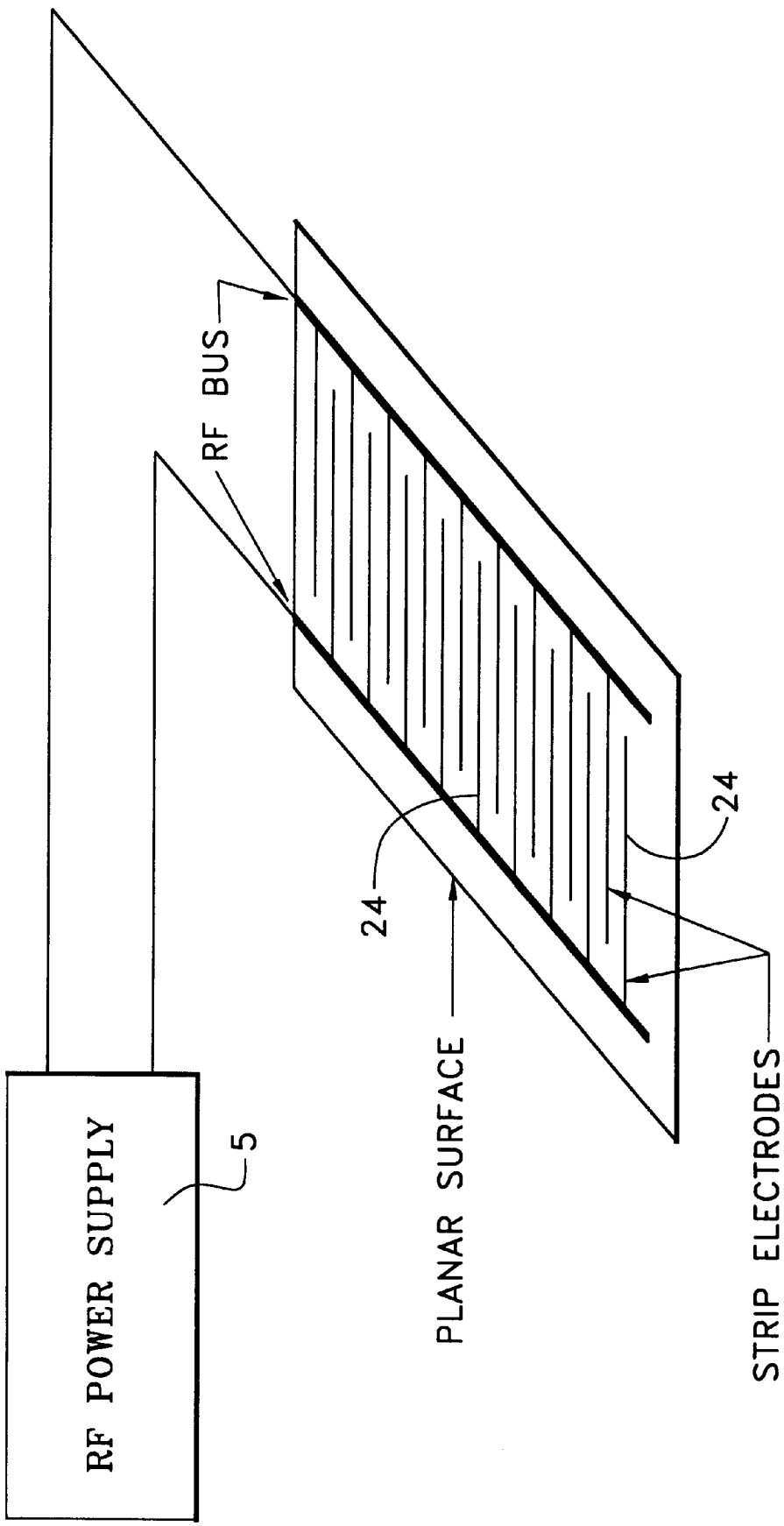
FIG. 5c is a schematic diagram of a parallel plate reactor for generating a plasma using parallel strip electrodes.

As is further illustrated in FIGS. 5a and 5b, the counter electrode 22' of the plasma cleaning apparatus 20' (which is otherwise similar to the apparatus 20 of FIG. 4) is advantageously implemented as a mold-image of the workpiece, following the contours of the workpiece to be cleaned. In this configuration, the workpiece 21 (e.g., a curved or three-dimensional workpiece) again acts as one of the electrodes, and is mated with a correspondingly shaped counter electrode 22'. The counter electrode 22' is implemented as an insulated surface 23, on which are disposed a plurality of strip electrodes 24 which are spaced apart from and generally parallel to each other. Two versions of this physical arrangement are possible, each having a characteristic mode of electrical connection. In one mode, shown in FIG. 5a, an insulated metallic surface 23 is connected to one phase of the RF power supply, and all of the strip electrodes 24 are parallel connected to the opposite phase of the RF power supply. This configuration will produce a quasi-electrostatic dipolar geometry, with electric field lines arching between the strip electrodes 24 and the metallic surface 23 (below the insulating layer between them). In a second mode, shown in FIG. 5b, an insulated (electrically conducting or electrically insulating) surface 23' is either floating (open) or grounded, and alternate parallel electrode strips 24 are connected to opposite phases of the RF power supply. This configuration will produce a dipolar electrostatic geometry with electric field lines arching between adjacent parallel strips 24. FIG. 5c shows a similar application of strip electrodes 24 to a substrate formed as a flat plate, which can be connected with the power source 5 in different configurations to generate a plasma above the flat plate electrode.

Figure 5D:
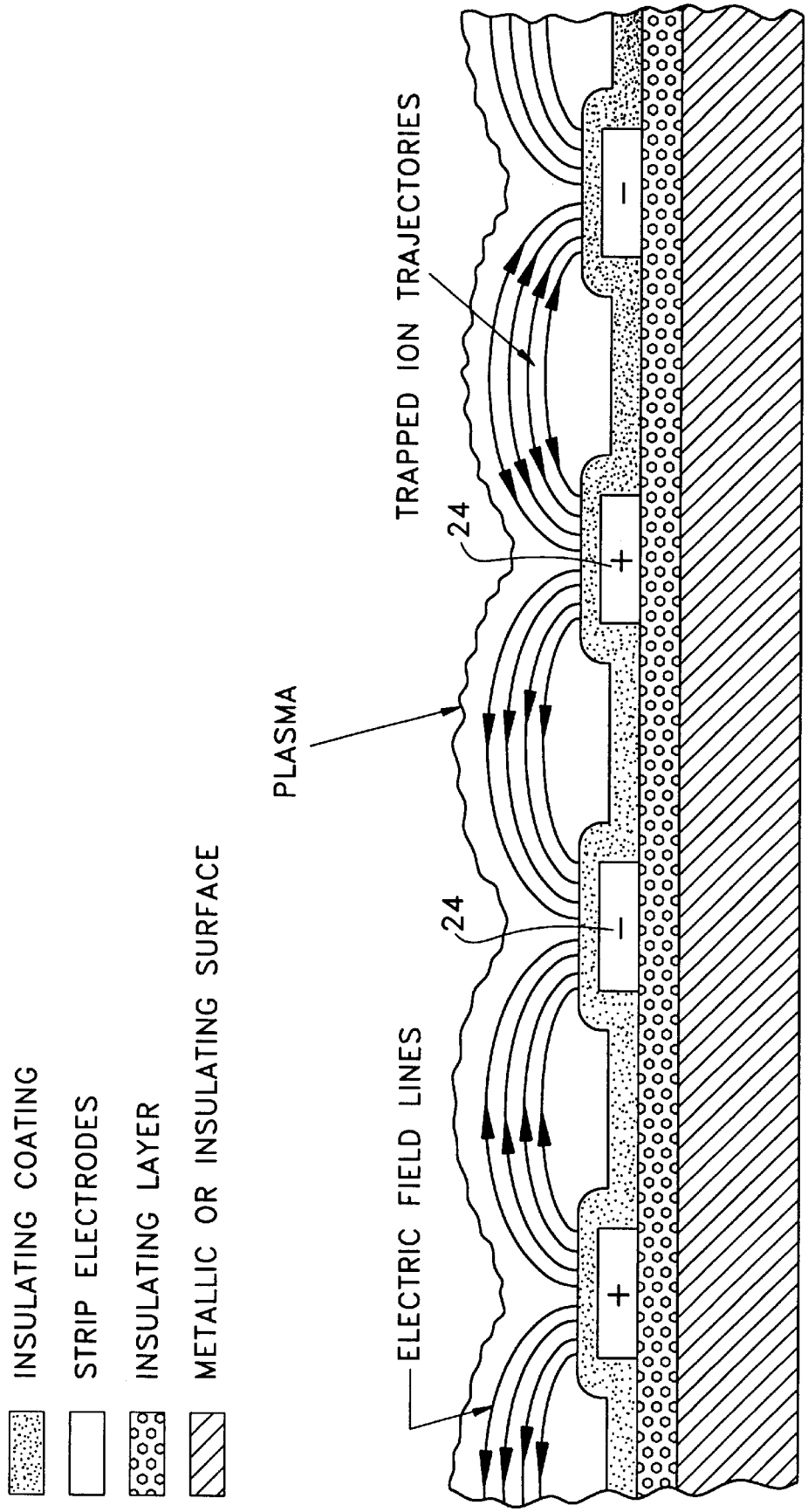
FIG. 5d is a schematic representation of electric field lines produced by parallel strip electrodes in the generation of a plasma.

In the embodiments of FIGS. 5a and 5b, the RF voltage is made high enough to generate electric fields above the surface of the mold-image sufficient to generate a plasma. This would similarly apply to the flat plate embodiment of FIG. 5c. Electric field levels of about 10 kilovolts per centimeter are sufficient for this in one atmosphere of air. For the low frequency ion trapping mechanism, the RF frequency should be relatively low, from about 100 Hz to about 30 kHz. Referring to FIG. 5d, the frequency should be low enough that ions are trapped on the electric field lines between electrodes during a half-cycle of the RF oscillation, but not high enough to similarly trap electrons (which can lead to the formation of filamentary discharges instead of a uniform plasma).

The use of mold-images in accordance with the present invention is useful in cleaning complicated workpieces, with two or three-dimensional curvatures, as well as the more simple, planar workpieces. The plasma-creating mold-image can be used to clean complicated three-dimensional workpieces, whether insulating or electrically conducting.

The plasma cleaning process of the present invention includes the steps of generating a steady-state, uniform glow discharge plasma by means such as those disclosed above, or equivalent means, at or about one atmosphere of pressure (e.g., in a range of from 10 torr to 20 bar) and in atmospheric air or other gases, and exposing the surface of a workpiece to the active species of the plasma for an appropriate period of time. In this way, contaminants such as hydrocarbons, oils, oxides, pathogenic organisms, tightly bound monolayers, and virtually anything that will react with oxygen (or other active species) can be removed from any of a number of materials including metals, plastics, polymers, webs and thin films, paper, and the like, for purposes of cleaning, sterilization and bonding to desired surfaces.

Exposure times on the order of a few minutes are generally sufficient. Resulting from such exposure, it has been found that the characteristic distilled water, advancing contact angle (as measured by a Sessile Water Drop Test) of metals can be improved from about 90° (as shown in FIG. 6a) to values less than 10° (as shown in FIG. 6b). The water drop contact diameter can similarly be improved from about 3 mm to about 10 mm, or more. Such lowering of the contact angle is an expected result of the removal of bound monolayers from the surface of the material, leaving the surface in an unprecedented state of cleanliness. This, in turn, leads to superior sterilization, and to the superior bonding of paint, electroplated layers, adhesives, and other forms of coatings.

The duration of workpiece exposure is related to changes in, and may be adjusted by changing, the plasma density (power density). For example, a given cleaning effect (water contact angle) can be achieved by applying a lower power density plasma (on the order of 1 milliwatt/cm$^3$) for a longer period of time (7 to 10 minutes), or by applying a higher power density plasma (on the order of 100 milliwatts/cm$^3$) for a shorter period of time (several seconds). This will also depend on the initial state of cleanliness of the surface, with the dirtier surfaces taking somewhat longer to clean than those surfaces which are less dirty. In practice, the applied voltage will be less critical than the plasma power density. Useful electric fields will generally range from 1 to 12 kV/cm (e.g., applied electric fields on the order of 2.5 kV/cm for gases such as helium, and 8.5 kV/cm for gases such as air).

The preferred operating gas is atmospheric air since it is available at no cost, and is capable of providing oxidizing active species to remove adsorbed monolayers of hydrocarbon machining oils (a common contaminant of metals which interferes with many kinds of surface coating, adhesion, and bonding). Virtually anything that can be gassified may be used, if desired. Gases containing oxygen, oxygen mixtures or oxygen molecules are in many cases the most effective. However, when the adsorbed monolayers consist of materials which require other kinds of active species, other operating gases are appropriate. For example, hydrogen or another reducing gas may be used if a reducing atmosphere is required to remove the monolayers which are present, while helium or another noble gas may be used if a lack of chemical activity is beneficial.

Figure 7:
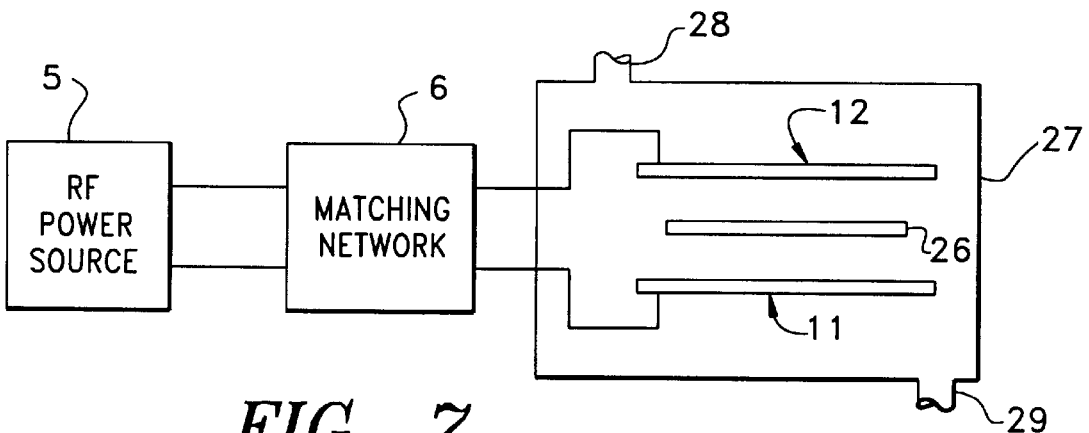
FIG. 7 is a schematic diagram of an enclosed plasma cleaning system.

FIG. 7 shows an embodiment of an apparatus 25 for plasma cleaning a workpiece 26 in accordance with the present invention using active species derived from gases other than atmospheric air. The apparatus 25 substantially corresponds to the apparatus 10 of FIG. 2. However, in this case, the region containing the electrodes 11, 12 is surrounded by a suitable enclosure 27 for containing a working atmosphere (i.e., the gas selected for a particular application). The enclosure 27 is advantageously formed of Plexiglas® sheet, or equivalent materials such as glass, which are both satisfactory in terms of their ability to contain an atmosphere and to absorb ultraviolet radiation (of the plasma), as well as transparent for viewing purposes. Metal enclosures may also be used, if desired. An inlet 28 is provided for receiving the working gas, and a corresponding outlet 29 is provided for discharge of the working gas (in otherwise known fashion). The enclosure 27 can also be used when the working gas is air, either at a reduced pressure or at an elevated pressure, as previously described.

EXAMPLE

The following is provided as an example of one atmosphere uniform glow discharge plasma cleaning, and is illustrative of the present invention, but should not in any way be considered as limiting the scope of the present invention.

The plasma cleaning process of the present invention was carried out at one atmosphere, in air. Flat metallic samples (in a plane parallel geometry) were used as one of the RF electrodes (i.e., the apparatus of FIG. 1). The samples were 6×8 cm, 1.5 mm thick, and were made of a ferrous mild steel widely used in the automotive industry. These samples arrived in two states. In an "as received" state, the samples had not yet been cleaned or treated following final buffing and polishing at the fabrication plant. In a "cleaned" state, the samples had first been cleaned with a proprietary detergent, and thereafter cleaned in an acid bath. Both sets of samples produced contact angles of 70° to 90° in a water drop test.

Both sets of samples were then subjected to standard dishwashing procedures involving hot water, a conventional kitchen detergent and scouring with a fine grade of steel wool. After this treatment, the contact angle and wettability of the samples was virtually unchanged. The water contact angles remained in a range of 70° to 90°, and the wetted contact diameter of the water drop was about 3 mm. When the water droplets evaporated from the surface of these samples, the surface was unoxidized and remained smooth, lustrous and typical of polished steel.

Both sets of samples were then exposed to a one atmosphere uniform glow discharge plasma in atmospheric air for periods of from three to six minutes. Such exposure reduced the water contact angle from the untreated values of 70° to 90°, to values lower than 10°. While this varied slightly with duration, it was clear that 3 minutes of exposure to an air plasma was sufficient to produce a large decrease in contact angle, and hence, a significant removal of adsorbed (probably hydrocarbon) monolayers (which may play a role in degrading bonding to the samples).

Similar testing under similar conditions was performed with various materials including aluminum, stainless steel, plastics, and plastic films, and similar results were achieved with exposure times as little as 30 to 60 seconds. Such test samples have retained low water contact angles and wettability for more than 3 months with no appreciable indication of degradation.

It will be understood that various changes in the details, materials and arrangement of parts which have been herein described and illustrated in order to explain the nature of this invention may be made by those skilled in the art within the principle and scope of the invention as expressed in the following claims. As an example, it has been found that the improvements of the present invention can also be used to rapidly dry (and fix) newsprint, avoiding smudging in subsequent use.

What is claimed is:

1. A method for removing contaminants from a surface of a workpiece to provide a cleaned workpiece, comprising the steps of generating a steady-state, radio-frequency (RF), uniform glow discharge plasma at a pressure of from 10 torr to 20 bar, and exposing the surface with the contaminants to the generated plasma for a set period of time, thereby removing the contaminants and yielding the cleaned workpiece, wherein:

the workpiece is a planar workpiece; and the method further comprises the step of generating the plasma between a pair of parallel plate electrodes, wherein one of the electrodes is the workpiece.

2. The method of claim 1 which further comprises the step of operating the radio frequency uniform discharge plasma at a frequency of from 100 Hz to 30 kHz.

3. The method of claim 1 wherein the plasma is generated in air.

4. The method of claim 1 wherein the workpiece is selected from the group consisting of metals, plastics, polymers, papers, webs and films.

5. The method of claim 1 wherein the cleaned workpiece exhibits a characteristic distilled water, advancing contact angle of less than 10 degrees, as measured by a Sessile Water Drop Test.

6. The method of claim 1 which further comprises the step of enclosing the plasma and the workpiece in a protective barrier for receiving a plasma producing gas at a selected pressure.

7. The method of claim 2 which further comprises the step of operating the radio frequency the uniform glow discharge plasma having an electric field of from 1 to 12 kV/cm.

8. The method of claim 2 which further comprises the step of producing an electric field for trapping ions in the electric field without trapping electrons in the electric field, wherein said ions and said electrons are produced by said plasma.

9. A method for removing contaminants from a surface of a workpiece to provide a cleaned workpiece, comprising the steps of generating a steady-state, radio-frequency (RF), uniform glow discharge plasma at a pressure of from 10 torr to 20 bar, and exposing the surface with the contaminants to the generated plasma for a set period of time, thereby removing the contaminants and yielding the cleaned workpiece, wherein:

the workpiece is an electrical conductor having a three-dimensional shape; and the method further comprises the step of generating the plasma between the workpiece, which acts as a first electrode, and a second electrode formed as a mold-image having a shape corresponding to the shape of the workpiece.

10. The method of claim 9 wherein the workpiece is curved.

11. A method for removing contaminants from a surface of a workpiece to provide a cleaned workpiece, comprising the steps of generating a steady-state, radio-frequency (RF), uniform glow discharge plasma at a pressure of from 10 torr to 20 bar, between a first and a second electrode and exposing the surface with the contaminants to the generated plasma for a set period of time, thereby removing the contaminants and yielding the cleaned workpiece, wherein:

the workpiece has a three-dimensional shape; and the method further comprises the steps of generating the plasma between the workpiece, which acts as a first electrode, and a second electrode formed as a mold-image having a shape corresponding to the shape of the workpiece and wherein said second electrode comprises an insulated metallic surface receiving a plurality of strip electrodes for connection to a plasma generating power source, and exposing the workpiece to the plasma generated by the mold-image.

12. The method of claim 11 wherein the contaminants are selected from the group consisting of hydrocarbons, oils, oxides, pathogenic organism, bound monolayers and materials which react with oxygen, oxygen mixture or oxygen molecules.

13. The method of claim 11 which further comprises the step of applying a coating to the cleaned workpiece and bonding the coating to the cleaned workpiece.

14. The method of claim 11 wherein the strip electrodes are spaced from and generally parallel to each other, the insulated metallic surface is connected to one phase of an RF power supply and all the strip electrodes are connected to the opposite phase of the RF power supply, wherein a quasi-electrostatic dipolar geometry, with electric field lines arching between the strip electrodes and the metallic surface are produced.

15. The method of claim 13 wherein the coating is selected from the group consisting of paints, adhesives and electroplated layers.

16. An apparatus for removing contaminants from a surface of a workpiece to provide a cleaned workpiece, which comprises a first and second electrode to generate a steady-state, radio frequency (RF), uniform glow discharge plasma at a pressure of from 10 torr to 20 bar for exposing the surface with the contaminants to the generated plasma for a set period of time to remove the contaminants and yielding the cleaned workpiece;

the workpiece is an electrical conductor having a curved shape; and the plasma is generated between the workpiece, which acts as the first electrode, and the second electrode having a curved shape corresponding to the shape of the curved workpiece.

17. The apparatus of claim 16 in which the plasma is generated in a gas selected from the group consisting of noble gases, including helium, neon, and argon, nitrous oxide, carbon dioxide, nitrogen, mixtures thereof and mixtures with oxygen.

18. The apparatus of claim 16 in which the workpiece is selected from the group consisting of metals, plastics, polymers, papers, webs and films.

19. An apparatus for removing contaminants from a surface of a workpiece to provide a cleaned workpiece, wherein:

the apparatus is configured to generate a steady-state, radio-frequency (RF), uniform glow discharge plasma at a pressure of from 10 torr to 20 bar for exposing the surface with the contaminants to the generated plasma for a set period of time to remove the contaminants and yielding tie cleaned workpiece;

the workpiece has a three-dimensional shape, and the plasma is generated between the workpiece, which acts as a first electrode, and a second electrode formed as a mold-image having a shape corresponding to the shape of the workpiece wherein said second electrode comprises an insulated surface receiving a plurality of strip electrodes for connection to a plasma generating power source, and exposing the workpiece to the plasma generated by the mold-image.

20. The apparatus of claim 19 wherein the plasma generating power source comprising radio frequency power source is operated at a frequency of from 100 Hz to 30 kHz.

21. The apparatus of claim 19 wherein ions and electrons are produced by said plasma, and the plasma generating power source operates to produce an electric field for trapping said ions in the electric field without trapping said electrons in the electric field.

22. The apparatus of claim 19 wherein the plasma is generated in air.

23. The apparatus of claim 19 wherein the plasma is generated in a gas selected from the group consisting of noble gases including helium, neon and argon, nitrous oxide, carbon dioxide, nitrogen, mixtures thereof and mixtures with oxygen.

24. The apparatus of claim 19 wherein the contaminants are selected from the group consisting of hydrocarbons, oils, oxides, plasticizers and materials which react with oxygen, oxygen mixtures or oxygen molecules.

25. The apparatus of claim 19 wherein the workpiece is selected from the group consisting of metals, plastics, polymers, papers, webs and films.

26. The apparatus of claim 19 further comprising means for applying a coating to the cleaned workpiece, and bonding the coating to the cleaned workpiece.

27. The apparatus of claim 19 wherein the coating is selected from the group consisting of paints, adhesives and electroplated layers.

28. The apparatus of claim 19 wherein the cleaned workpiece exhibits a characteristic distilled water, advancing contact angle of less than 10 degrees, as measured by a Sessile Water Drop Test.

29. The apparatus of claim 19 wherein the workpiece is an electrical conductor and wherein the workpiece is biased relative to the second electrode.

30. The apparatus of claim 19 wherein the workpiece is an electrical conductor and wherein the workpiece is grounded relative to the second electrode.

31. The apparatus of claim 19 wherein the workpiece is an electrical insulator.

32. The apparatus of claim 19 wherein the plasma and the workpiece are enclosed in a protective barrier for receiving a plasma producing gas at a selected pressure.

33. The apparatus of claim 19 wherein the strip electrodes are spaced from and generally parallel to each other, the metallic insulated surface is floating or is grounded, and alternate parallel electrode strips are connected to opposite phases of an RF power supply, wherein a dipolar electrostatic geometry with electric field lines arching between adjacent parallel strips are produced.

34. The apparatus of claim 20 wherein the radio frequency power source operates to provide a plasma having an electric field of from 1 to 12 kV/cm.

35. A method for removing contaminants from a surface of a workpiece to provide a cleaned workpiece, comprising the steps of generating a steady-state, radio-frequency (RF), uniform glow discharge plasma at a pressure of about one atmosphere between electrodes using an RF power source operating at a frequency of from about 100 Hz to about 30 kHz, and exposing the surface with the contaminants to the generated plasma, thereby removing the contaminants and yielding the cleaned workpiece and wherein said plasma produces ions and electrons, the RF power source operating with the electrodes to produce an electric field which traps said ions in the electric field without trapping said electrons in the electric field, thereby causing a quasi-neutral build up of positive potential of the plasma, with the electrons free to leave the plasma and collect or recombine on the surfaces of the electrodes, wherein the method is performed until the surface of the workpiece exhibits a characteristic distilled water, advancing contact angle of less than 10 degrees, as measured by a Sessile Water Drop Test, and a water drop contact diameter improvement from about 3 mm to about at least 10 mm.

36. The method of claim 35 which further comprises the step of supporting the workpiece between the parallel plate electrodes.

37. The method of claim 35, wherein the plasma is generated at a power density of from about 1 milliwatt/cm$^3$ to about 100 milliwatts/cm$^3$.

38. The method of claim 35, wherein the RF power source provides an electric field for the plasma of from about 1 kV/cm to about 12 kV/cm.

39. The method of claim 35, wherein the exposure time of the surface of the workpiece to the plasma is less than about 6 minutes.

40. The method of claim 35, wherein the uniform glow discharge plasma is applied at room temperature.

41. The method of claim 35, wherein the operating gas in which the plasma is generated is air.

42. The method of claim 35, wherein the workpiece is a web, a film, or paper.

43. The method of claim 35, wherein the contaminants are individual monolayers of a hydrocarbon oil or of a plasticizer.

44. The method of claim 35 wherein the plasma is generated between a pair of parallel plate electrodes.

45. The method of claim 35 in which the contaminants are selected from the group consisting of hydrocarbons, oils, oxides, pathogenic organisms, bound monolayers and materials which react with oxygen, oxygen mixtures or oxygen molecules.

46. The method of claim 35 in which the workpiece is selected from the group consisting of metals, plastics, polymers, papers, webs and thin films.

47. The method of claim 36 wherein the workpiece is an electrical conductor, and wherein the method further comprises the step of biasing the workpiece relative to the electrodes.

48. The method of claim 36 wherein the workpiece is an electrical conductor, and wherein the method further comprises the step of grounding the workpiece relative to the electrodes.

49. The method of claim 36 wherein the workpiece is an electrical insulator.

* * * * *